US006915563B2

(12) United States Patent
Bolde et al.

(10) Patent No.: US 6,915,563 B2
(45) Date of Patent: Jul. 12, 2005

(54) APPARATUS FOR REMOVING ATTACHED DIE

(75) Inventors: Lannie R. Bolde, New Paltz, NY (US); Christopher Wayne Whittaker, Esopus, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,150

(22) Filed: Jun. 27, 2003

(65) Prior Publication Data

US 2004/0261261 A1 Dec. 30, 2004

(51) Int. Cl.⁷ .............................................. B23P 19/00
(52) U.S. Cl. ........................... 29/762; 29/758; 29/764; 29/825; 29/837
(58) Field of Search .................... 29/762, 764, 758, 29/825, 837, 270, 278; 73/788

(56) References Cited

U.S. PATENT DOCUMENTS

| 4,215,468 A | * 8/1980 | Greco ........................ 29/764 |
| 4,561,584 A | 12/1985 | Hug |
| 4,561,586 A | 12/1985 | Abel et al. |
| 4,586,252 A | * 5/1986 | Faticanti ..................... 29/762 |
| 4,671,764 A | * 6/1987 | Hehl ........................... 425/595 |
| 4,767,047 A | 8/1988 | Todd et al. |
| 4,858,820 A | 8/1989 | Kent |
| 4,894,910 A | * 1/1990 | Reimer et al. ................ 29/764 |
| 4,979,287 A | * 12/1990 | Schwab et al. .............. 29/764 |
| 5,046,389 A | * 9/1991 | Thompson et al. ........... 83/140 |
| 5,154,793 A | 10/1992 | Wojnarowski et al. |
| 5,553,766 A | 9/1996 | Jackson et al. |
| 5,556,024 A | 9/1996 | Olson et al. |
| 5,605,277 A | 2/1997 | Jackson et al. |
| 5,620,132 A | 4/1997 | Downing et al. |
| 5,636,781 A | 6/1997 | Olson et al. |
| 5,707,000 A | 1/1998 | Olson et al. |
| 5,738,267 A | 4/1998 | Olson et al. |
| 5,758,817 A | 6/1998 | Chapman |
| 5,779,133 A | 7/1998 | Jackson et al. |
| 5,782,403 A | 7/1998 | Wang |
| 5,785,237 A | 7/1998 | Lasto et al. |
| 5,836,071 A | 11/1998 | Falcone et al. |
| 5,862,588 A | 1/1999 | Heim et al. |
| 5,868,297 A | 2/1999 | Zabel et al. |
| 6,005,292 A | 12/1999 | Roldan et al. |
| 6,059,170 A | 5/2000 | Jimarez et al. |
| 6,163,014 A | 12/2000 | Bergeron et al. |
| 6,182,884 B1 | 2/2001 | Ma et al. |
| 6,257,478 B1 | 7/2001 | Straub |
| 6,300,782 B1 | 10/2001 | Hembree et al. |
| 6,313,651 B1 | 11/2001 | Hembree et al. |
| 6,320,163 B2 | 11/2001 | Bergeron et al. |
| 6,333,491 B1 | 12/2001 | Bergeron et al. |
| 6,360,940 B1 | 3/2002 | Bolde et al. |
| 6,811,072 B2 | 11/2004 | Bolde |

* cited by examiner

*Primary Examiner*—Carl J. Arbes
*Assistant Examiner*—Tai Van Nguyen
(74) *Attorney, Agent, or Firm*—Lisa J. Ulrich

(57) ABSTRACT

An apparatus for removing attached die having a pivoting means, having a pivot point and first and second sides, the pivot point having a corresponding first y coordinate, the first and second sides positioned opposite to one another, said pivoting means capable of attaching to a die carrier. The apparatus also having a shaft attached to the first side of the pivoting means. The apparatus further having a counterweight attached to the second side of the pivoting means. The apparatus lastly having a clamping means capable of attaching to at least one die, the die having a corresponding second y coordinate, wherein the first y coordinate is greater than the second y coordinate.

7 Claims, 5 Drawing Sheets

APPARATUS FOR REMOVING ATTACHED DIE

BACKGROUND OF INVENTION

Semiconductor devices typically comprise one or more semiconductor chips designed for performing a desired function. The manufacture of semiconductor devices begins with the manufacture of the semiconductor chips. Semiconductor chips are first produced in a wafer form. The semiconductor chips are subsequently diced from the wafer into individual chips and then packaged. Individual chips, or multiple chips, may be packaged on a suitable substrate such as a multilayer ceramic (MLC), multichip module (MCM), for instance.

Multichip module substrates are known in the art and thus only briefly described herein. In addition, a substrate may also be referred to as a package, wherein the terms are used interchangeably herein below. MCM substrates typically comprise a number of layers of ceramic material, including metalizations, internal wiring networks, vias, and bond pads. Each layer is first formed of an unfired ceramic material, then punched and patterned according to a desired semiconductor chip package design. The layers are then assembled and aligned together in a predetermined order. The unfired ceramic material is then fired and flattened, as necessary. The MCM substrate thus produced is used for making chip-to-package interconnection to the one or more semiconductor chips for which it was designed. Upon positioning and attaching of the semiconductor chip onto the substrate, the chip can then be electrically connected thereto, as appropriate. Electrical interconnection between the MCM package and the semiconductor (s) can be made using wirebonding, flip-chip, thermally activated bonding, and/or other chip-to-package interconnect techniques known in the art. The substrate also includes input/output pins, or other suitable form of input/output connections, for interfacing the chip to a next level of packaging, for example, to a printed circuit board, or the like.

Of course, the functionality of any such module depends, in large part, on the functionality of the integrated circuit chips mounted thereon. The chip need not be defective, itself, to engender marginal functionality since effects such as parasitic capacitances and capacitive coupling of portions of the chip either to itself or other portions of the module when the chip is mounted thereon can alter propagation time through circuits on the chip. Random variation in such propagation times may make certain individual chips incompatible with other individual chips when installed in a particular module. For that reason, it is sometimes necessary to remove a chip from a module for replacement. It is also often necessary to remove a chip from a module to complete a diagnostic analysis of a module in which some aspect of functionality is questionable.

Therefore, it is not unusual for a particular chip or a plurality of chips to be removed from a module and either replaced or reinstalled a relatively large number of times during the manufacture of a module. Since the chips are generally attached to the module by solder connections (generally made by melting solder bumps, known as C4's, which are connection pads already on the chip to connection pads on the module by heating the entire assembly) which provide both electrical connections and mechanical support, removal of one or more or even all of the chips from a module is essentially a desoldering operation involving the application of heat, mechanical separation of the chip and module and removing molten solder from the joint. This process is costly and time-consuming and may subject the chip and/or the module to temperatures which can cause degradation of or damage to either or both.

One conventional technique for removing C4 mounted chips from a substrate is to apply heat in order to melt or reflow the solder balls. One of the problems with the heating technique of removing a chip from a substrate is that there is a limit on the number of times the solder balls can be reflowed. Furthermore, if there are a plurality of chips on the substrates, the application of heat generally reflows the solder balls on all of the chip sites. With both the dimensions of chips and the spaces between them decreasing, the chances of affecting a functioning chip increase with each generation of chips. Still further, substrates are generally bulky and thus require a heating process time on the order of thirty minutes or longer. In addition, tooling for rendering such a hot process removal is very expensive, effectively costing on the order of 100–200 thousand dollars or more. Yet still further, applying localized heat is ineffective for C4 counts or connections above a few hundred.

Thus, there remains a need for a method of removing individual chips that minimizes the chances of affecting or changing the functionality of any of the chips on the module.

SUMMARY OF INVENTION

It is therefore an object of the present invention to provide an apparatus to remove identified chips from a substrate.

It is a further object of the present invention to provide an apparatus that can be used with current generation semiconductor chip carrier boats.

It is yet a further object of the present invention to provide a method of removing semiconductor chips which minimizes the force necessary to remove chips from a substrate.

In accordance with the above listed and other objects, we provide An apparatus for removing attached die, having a pivoting means, having a pivot point and first and second sides, the pivot point having a corresponding first y coordinate, the first and second sides positioned opposite to one another, said pivoting means capable of attaching to a die carrier;

a shaft attached to the first side of the pivoting means;

a counterweight attached to the second side of the pivoting means; and a clamping means capable of attaching to at least one die, the die having a corresponding second y coordinate, wherein the first y coordinate is greater than the second y coordinate.

DETAILED DESCRIPTION

One of the advantages of the instant invention is that it is contemplated that the apparatus to remove non-conforming and/or undesirable chips from semiconductor substrates can be attached to current style chip carriers including, but not limited to, Auerâ€¢ boats (manufactured by Auer Precision Incorporated in Mesa Ariz. While the term substrate is used, the instant application is not limited to traditional semiconductor packaging substrates. Throughout this discussion substrate will be used to represent the family of materials onto which electrical parts are congregated to form a super structure with interworking electrical parts as long as substrate the material is capable of withstanding the reflow temperature of the connecting material used to create the electrical/mechanical connection between the substrate and the connecting material. Solder will be used to represent the family of materials which can be used to form an electrical and/or mechanical connection between a semiconductor chip and a substrate. Further, while it is contemplated that semiconductor chips will be disposed in substrate, the substrate may also have other electrical parts including, but not limited to, capacitors, inductors, resistors and the like which may need to be removed for any number of reasons. There are many different styles of and functions for chip carrier boats. Finally, it is necessary for this invention that at least apparatus of the instant invention, and preferably the chip carrier boat be comprised of a material which is able to withstand, at least, the reflow temperature of the semiconductor electromechanical connecting material, usually solder.

Figure 1:
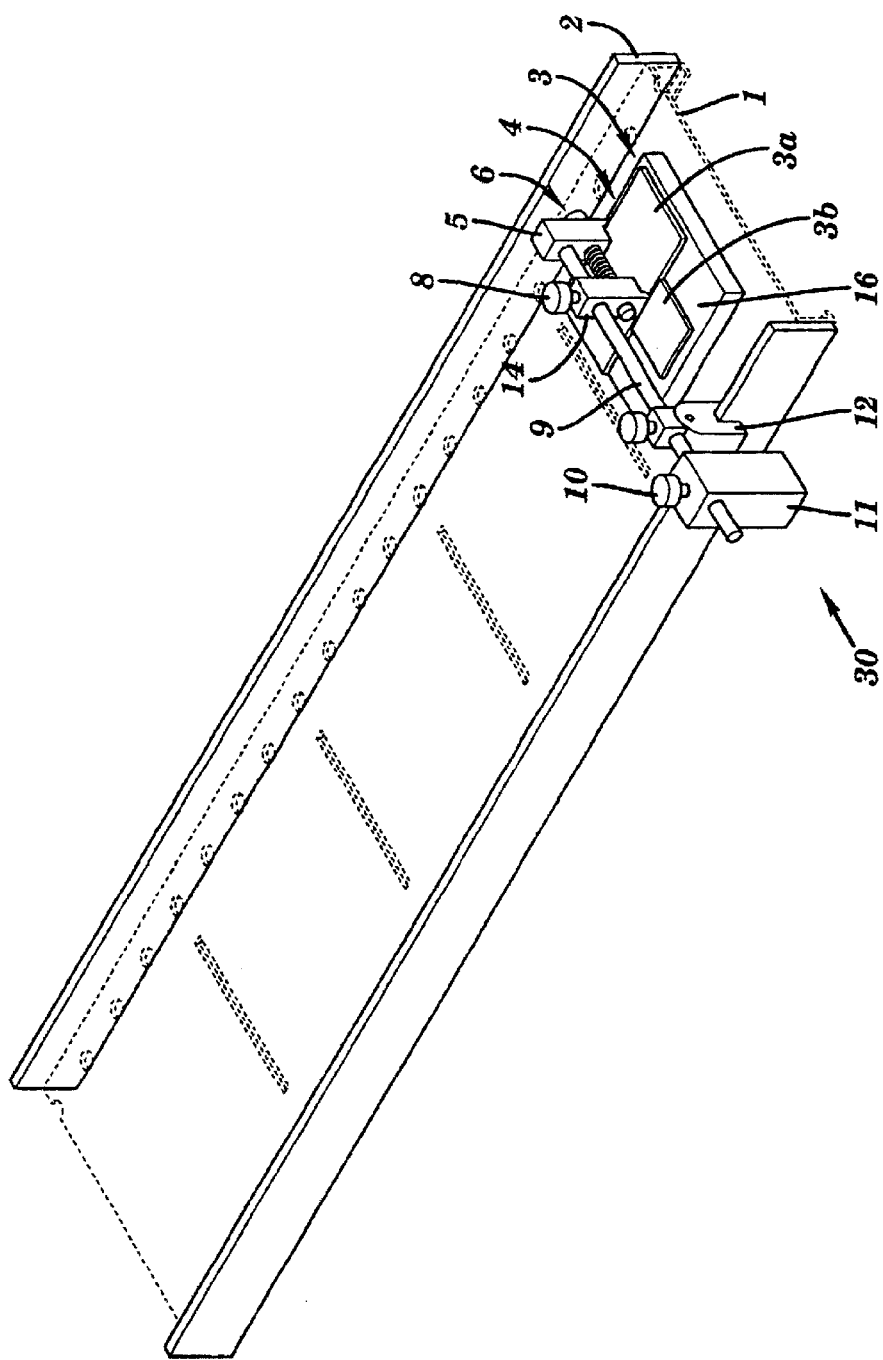
FIG. 1 is a top down view of a chip carrier boat with the apparatus of the invention attached.
Figure 2A:
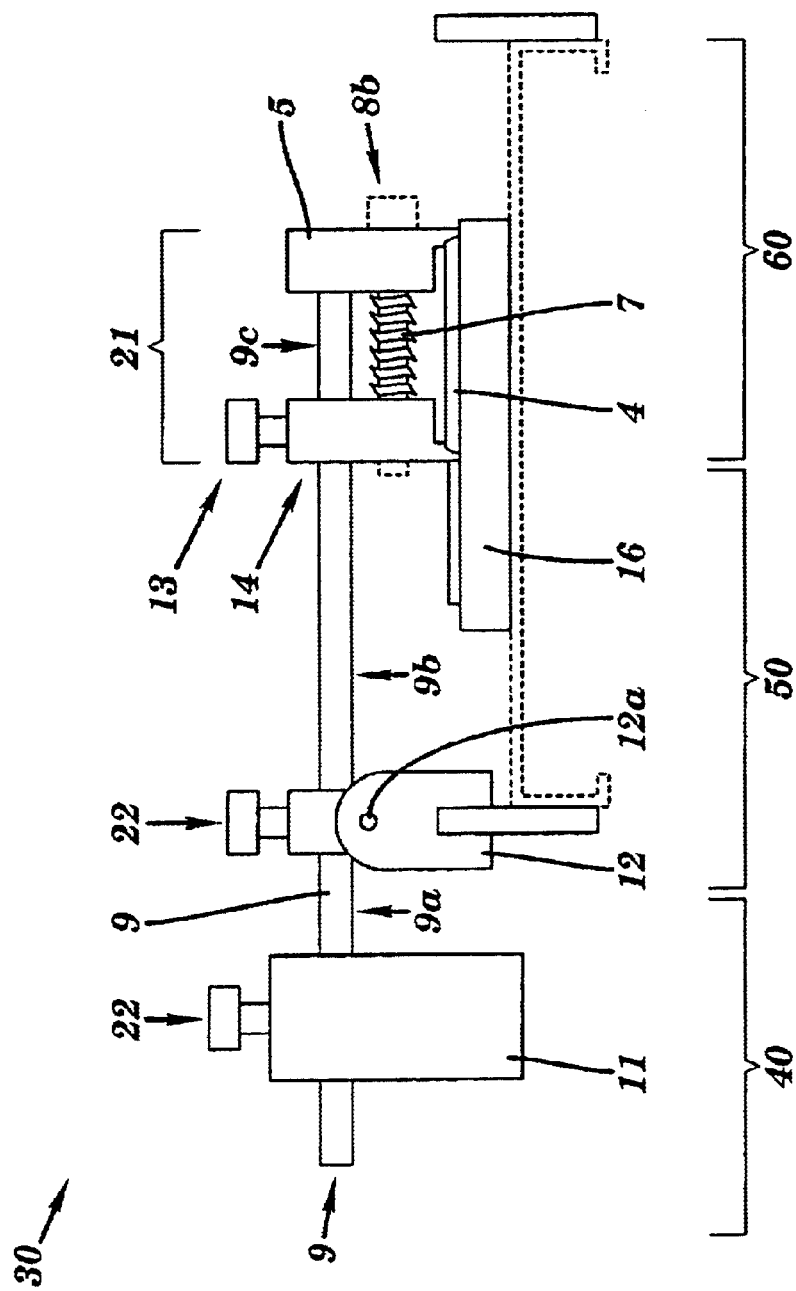
FIG. 2a is a top down view of a chip showing the centerlines.

In FIGS. 1, 2, 2a, 3 and 4 which are provided for illustrative purposes only and are not drawn to scale show an embodiment of the instant invention, like elements of the instant invention are referred to using the same number. In FIG. 1, a representative style of a chip carrier, 1, which can withstand the reflow temperature of solder is shown. A substrate, 16, having at least two semiconductor chips thereon, 3a and 3b, is disposed in the chip carrier, 1. A mounting rail, 2, may be attached to at least one side of the carrier. It is preferable if the apparatus of the instant invention is attached to the side of the chip carrier. The apparatus of the instant invention, is shown generally as 30. The apparatus of the instant invention, 30, is attached to the chip carrier, 1. The apparatus, 30, is also attached to the semiconductor chip (for examples 3a or 3b) which will be removed. As shown in FIG. 2a, each of the semiconductor chips has center lines which dissect the chip into four quadrants. Preferably, the apparatus is attached to the semiconductor chip to be removed and not to the substrate, 16, that the semiconductor chip, 3a or 3b, is disposed in.

Figure 2B:
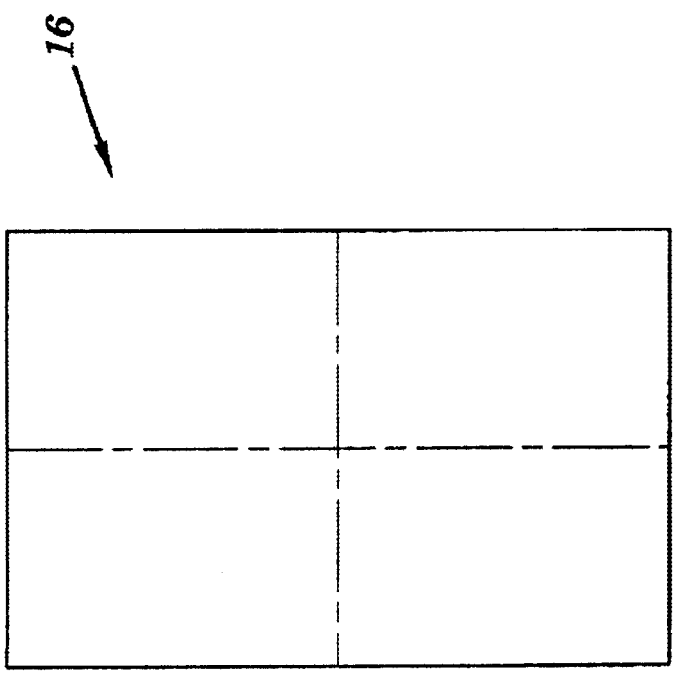
FIG. 2 is a side perspective view of the apparatus of this invention.

The apparatus, 30, is shown in more detail in FIG. 2. The apparatus, 30, comprises three sections, a weight portion, 40, a levering portion, 50, and a chip connection portion, 60. The weight portion, 40, comprises a weight block 11, and a shaft, 9a. Preferably, the user would be able to move the weight block, 11, along the shaft, 9a. Also preferably, the user would be able to fix the weight into a desired location by way of a tightening means, 22. More preferably, the tightening means, 22, would be a thumb screw. The levering section, 50, comprises a hinge, 12 and the shaft, 9b. The hinge having a pivot point 12a, about which the shaft, 9b, pivots. The hinge would allow the shaft portion to move the chip connection portion, 60. Also preferably, the user would be able to move the shaft, 9, into a desired location by way of a tightening means, 22. More preferably, the tightening means, 22, would be a thumb screw. Preferably, the shafts of the weight and levering portions, 9a and 9b, would be one integral piece and the shaft, 9, would be movably attached to the hinge, 12. The chip connection portion, 60, comprises a connection means, 21, and a shaft, 9c. The connection means, 21, attaches to the individual chip to be removed, 3a or 3b. The connection means would preferably clamp to the chip being removed. In a preferred embodiment the connection means would be movably attached to the shaft, 9c. Also preferably, shaft 9c would be integrally attached to shaft 9b. Even more preferably, shaft 9b would be integrally attached to shaft 9a.

In a preferred embodiment, the connection means, 21, would comprise clamp jaws, 5. The clamp jaws, 5, would be able to selectively attach to the chip being removed. Preferably, the clamp jaws, 5, would apply pressure to the sides of the chip to be removed, 3a or 3b, such that the chip would move with the clamp jaws if the chip were not fixedly attached to the substrate, 16. In a preferred embodiment, as shown in FIG. 2, the clamp jaws would be movably attached to the shaft, 9. The clamp jaws would have a thumb screw, 8a, (only shown for one side of the clamp jaws) which would allow a user to fix the position of the clamp jaws, 5, on the shaft, 9, after the chip is clamped within the jaws. The two clamp jaws would also be attached by a thumb screw, 8b, and a spring, 7 which would allow a user to tighten or loosen, i.e. change the force, the clamp jaws, 5, exert on semiconductor chips of varying sizes and shapes. However, it is preferable that the clamp jaws not supply a force on the chip that would affect the future operability of the chip, or change in any way the existing inoperability of the chip.

In a most preferred embodiment of the apparatus of the instant invention, where the semiconductor chips extend above the surface of the substrate, the pivot point of the hinge would be higher then the surface of the chip to be removed. That is to say, when measured from a reference point on the surface of the substrate, the vertical distance between the top of the chip to be removed is less than the vertical distance between the reference point and the pivot point.

In this first position, as shown in FIG. 2, the weight block of the apparatus exerts a force on a chip that is clamped in the clamp jaws of the apparatus described herein. This first state is called the at rest state. It is understood that the force exerted may be less than the force necessary to overcome the electrical/mechanical connector bonds that exist between the substrate and the semiconductor chip at the existing temperature. It is preferable that the force exerted by the apparatus when the system is at rest be less than the shear force necessary to break the connector bonds between the semiconductor chip and the substrate at the existing temperature. When an engineer employs the apparatus described above to remove a semiconductor chip, the instant invention contemplates that the engineer knows, or can ascertain, the force needed to overcome the electrical/mechanical connectors (solder) bonds connecting the semiconductor chip to the substrate for a broad range of temperatures. It is of particular interest for the preferred embodiment of this invention that the engineer know, or ascertain, the minimal force needed to overcome the solder bonds and the corresponding temperature and pressure. This temperature is generally known as the reflow temperature. The engineer is the final arbiter of the correct temperature/force value that will be used to remove the chip from the substrate as certain other semiconductor chip/substrate decisions may have to be factored in. It will be assumed for purposes of discussion that no overt attempts to affect the pressure that the chip carrier boat, semiconductor chip, substrate and apparatus will be subjected to when removing the semiconductor chip from the substrate will be made; although such pressure changes would not affect the operability of the apparatus or the corresponding method of using the apparatus to be disclosed herein. If pressure changes are contemplated by the engineer then adjustments may have to be made to determine the minimal temperature/force values.

Once a force/temperature decision has been made by the engineer, the apparatus can be adjusted such that the force exerted by the weight block when the system is at rest is equal to, at least, the minimal force that will remove the solder at a given temperature. There are many ways to calculate the force exerted by the weight block. One method would be to use shafts and weight blocks of precise weights. Additionally, the shaft would be calibrated to facilitate the calculation of the force exerted on the chip to be removed.

Figure 3:
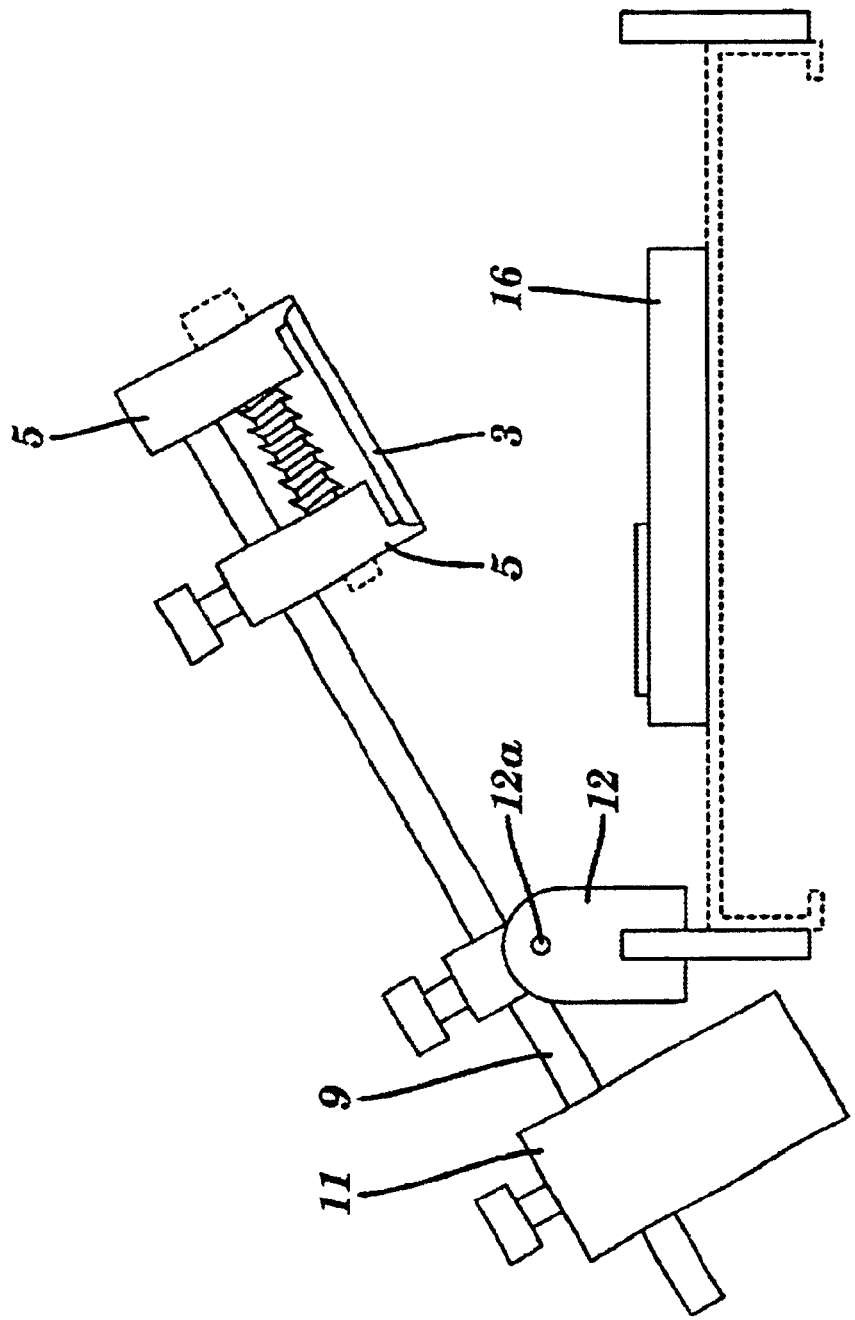
FIG. 3 is a side perspective view of one of the embodiments of the apparatus after practicing the method of the instant invention.

Then, the chip carrier boat with the apparatus of this invention attached and the substrate disposed within would be heated to the predetermined temperature. The counter balancing weight of the weight block will then lift the clamped chip from the substrate, as shown in FIG. 3. In a preferred embodiment, the gravitational pull of the weight block would be the only force exerted on the solder of the chip to be removed. Also in a preferred embodiment, the movement would be the minimum necessary to ensure that the desired chip would be completely removed from the chip. The shaft, to which the weight block is attached would be in the final position after the heating and removal of the desired chip. The weight of the weight block (and the weight of the chip) would determine the shaft final position and angle. In a preferred embodiment, the final position would be determined by the user, prior to engaging the apparatus of this invention. The user would adjust the position of the weight block so that the minimal force necessary was employed when lifting the chip off the substrate.

In a preferred method of the instant invention, a force meter would be used to measure the counterforce exerted by the cantilevered weight block. Preferably, the force would be measured along the shaft between the clamp jaws.

Figure 4:
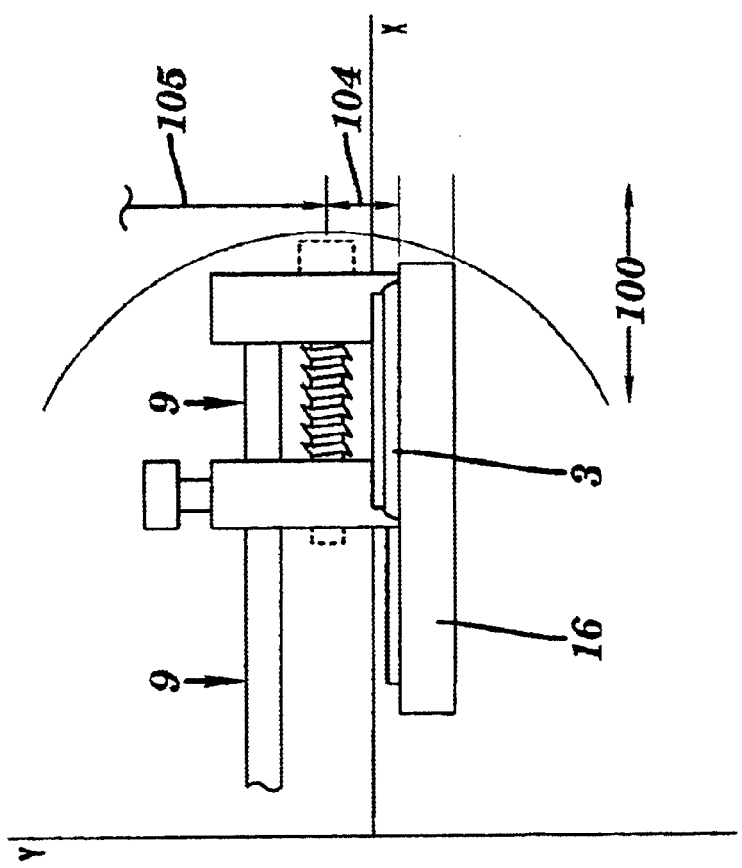
FIG. 4 is a side view of the apparatus showing the path of the chip when practicing the method of this invention.

Also preferably, the arc that the cantilevered chip being removed would follow would initially have an increasing x value, 100, as shown in FIG. 4 (then depending on the apparatus used, have a decreasing x value, 105. Where the x value of the arc is increasing, 104, the chip to be removed, 3, swings away from the substrate and the chances of the remaining, operable, chips affected by the apparatus and method of this invention are minimized. The arc path of interest is the arc path for the chip to be removed, 3, which could be different than the arc path for the shaft, 9, since they are not on the same horizontal plane when in the rest state. The path of the arc would preferably be measured from the chip to be removed.

The apparatus of the instant invention could be devised such that the motion of the chip to be removed is stopped before (or at) the arc path for the chip becomes negative. The motion of the shaft could be stopped once the desired chip is removed but before the counterweight had reached the final state.

If the amount of force exerted by the weight block (the counterweight) needs adjusting then there are a number of ways to adjust the force. Ways that the force can be adjusted include, but are not limited to, moving the shaft itself, adding a weight to the shaft in the levering portion, or the moving the weight block. In a preferred embodiment of the instant invention, when the force exerted on the semiconductor chip needs to be adjusted to achieve the predetermined value, the engineer would first move the weight block to achieve the predetermined value.

In a preferred embodiment, prior to measuring the force, the engineer would precisely place the clamping jaws according to the method described herein. The hinge portion which attaches the apparatus to the chip carrier boat would be positioned such that pivot point is on a parallel with one of the center lines of the chip to be removed and the shaft is straight. Also in a preferred embodiment, the shaft would be horizontally parallel when in the rest state.

While the invention has been described in terms of specific embodiments, it is evident in view of the foregoing description that numerous alternatives, modifications and variations will be apparent to those skilled in the art. Thus, the invention is intended to encompass all such alternative, modifications and variations which fall within the and spirit of the invention and the appended claims.

We claim:

1. An apparatus for removing attached die, comprising:

a pivoting means, having a pivot point and first and second sides, the pivot point having a corresponding first y coordinate, the first and second sides positioned opposite to one another, said pivoting means capable of attaching to a die carrier;

a shaft attached to the first side of the pivoting means;

a counterweight attached to the second side of the pivoting means; and a clamping means capable of attaching to at least one die, the die having a corresponding second y coordinate, wherein the first y coordinate is greater than the second y coordinate, upon removal of the at least one die, the at least one die in said clamping means pivots about said pivot point.

2. The apparatus according to claim 1, further comprising:

A die carrier, the pivoting means attached to the die carrier; and a die positioned in said die carrier.

3. The apparatus according to claim 1, wherein the clamping means is clamped on at least one die.

4. The apparatus of claim 1, wherein the clamping means is clamped alone a centerline of the at least one die.

5. The apparatus of claim 1, wherein, upon removal, the at least one die pivots in an arc having corresponding x and y coordinates.

6. The apparatus of claim 5, wherein the arc is measured from the at least one die and at least a portion of x coordinates for the arc are of increasing value.

7. The apparatus of claim 6, wherein the initial set of x coordinates upon die removal are of increasing value.

* * * * *